United States Patent
Brodin et al.

(10) Patent No.: US 8,917,102 B2
(45) Date of Patent: Dec. 23, 2014

(54) METHOD, CAPACITANCE METER, COMPUTER PROGRAM AND COMPUTER PROGRAM PRODUCT FOR IMPROVED CAPACITANCE MEASUREMENT

(75) Inventors: Alf Brodin, Hedemora (SE); Jon Lissmats, Borlänge (SE); Jerry Svedlund, Hedemora (SE); Hans Olof Fröjd, Gävle (SE)

(73) Assignee: ABB Technology AG, Zürich (CH)

( * ) Notice: Subject to any disclaimer, the term of this patent is extended or adjusted under 35 U.S.C. 154(b) by 818 days.

(21) Appl. No.: 12/884,273

(22) Filed: Sep. 17, 2010

(65) Prior Publication Data
US 2011/0101999 A1    May 5, 2011

(30) Foreign Application Priority Data
Sep. 18, 2009   (EP) ..................... 09170649

(51) Int. Cl.
G01R 27/26   (2006.01)
(52) U.S. Cl.
CPC ................. G01R 27/2605 (2013.01)
USPC .......... 324/681; 324/649; 324/652; 324/658; 324/668; 324/678; 324/76.41; 324/750.17; 324/711; 324/334
(58) Field of Classification Search
USPC ............. 324/76.41, 649, 652, 658–668, 678, 324/681, 750.17, 334, 711
See application file for complete search history.

(56) References Cited

U.S. PATENT DOCUMENTS

| | | |
|---|---|---|
| 4,849,686 A | 7/1989 | Lyyra |
| 5,283,528 A | 2/1994 | Van Seeters |
| 5,504,430 A | 4/1996 | Andersson |
| 6,707,306 B1 | 3/2004 | Wendt |
| 7,046,017 B1 | 5/2006 | Drost et al. |
| 7,173,438 B2 | 2/2007 | Pooranakaran et al. |

(Continued)

FOREIGN PATENT DOCUMENTS

| | | |
|---|---|---|
| CN | 86206128 U | 5/1987 |
| CN | 1083221 A | 3/1994 |

(Continued)

OTHER PUBLICATIONS

Mark Waldrrip and Richard Tse, Capacitance Measurement; May 2000; TDK Components USA, Inc.*
European Search Report—Mar. 15, 2010.
First office action issued in Chinese patent application 201010255489.9, Dec. 26, 2013.

*Primary Examiner* — Arleen M Vazquez
*Assistant Examiner* — Son Le
(74) *Attorney, Agent, or Firm* — Venable LLP; Eric J. Franklin

(57) ABSTRACT

A method for measuring a capacitance using a capacitance meter. The capacitance meter includes an AC power source with a controllable frequency which is fed to a capacitor to measure its capacitance. A first measurement of the capacitance is performed by the capacitance meter using a first frequency. When the first measurement of the capacitance indicates the capacitance is below a threshold capacitance a lower capacitance measurement is performed in the capacitance meter, using a second measurement of the capacitance using a second frequency. When the first measurement of the capacitance indicates the capacitance is above a threshold capacitance, a higher capacitance measurement is performed in the capacitance meter, using a second measurement of the capacitance using a third frequency, the third frequency being lower than the second frequency.

8 Claims, 2 Drawing Sheets

(56) References Cited

U.S. PATENT DOCUMENTS

| | | |
|---|---|---|
| 2003/0218473 A1 | 11/2003 | Yamashita et al. |
| 2006/0192568 A1 | 8/2006 | Pasero et al. |
| 2007/0194800 A1 | 8/2007 | Novikov et al. |
| 2008/0068029 A1 | 3/2008 | Tanida et al. |
| 2010/0326282 A1* | 12/2010 | Carbonini et al. ............ 99/280 |
| 2011/0089767 A1* | 4/2011 | Rocke et al. ................ 307/102 |

FOREIGN PATENT DOCUMENTS

| | | |
|---|---|---|
| CN | 101339218 A | 1/2009 |
| EP | 0555526 B1 | 8/1993 |
| GB | 2246639 A | 2/1992 |
| WO | WO-2008/010634 A1 | 1/2008 |

* cited by examiner

METHOD, CAPACITANCE METER, COMPUTER PROGRAM AND COMPUTER PROGRAM PRODUCT FOR IMPROVED CAPACITANCE MEASUREMENT

CROSS-REFERENCE TO RELATED APPLICATIONS

This application claims priority to European patent application 09170649.9 filed 18 Sep. 2009.

BACKGROUND

Since the advent of capacitors, there has been a need to measure the main magnitude of capacitors, i.e. the capacitance.

One known way to measure the capacitance of a capacitor is to connect an alternating current to the capacitor and observe the voltage. It is also known to use two frequencies to increase the accuracy of the measurement.

However, there is always a need to further improve the accuracy of capacitance measurements.

SUMMARY

The present invention overcomes or at least reduces the problems of the prior art.

It is presented a method for measuring a capacitance using a capacitance meter, the capacitance meter comprising an AC power source with a controllable frequency which is fed to a capacitor to measure its capacitance. The method comprises the steps of: performing, in the capacitance meter, a first measurement of the capacitance using a first frequency; when the first measurement of the capacitance indicates the capacitance being below a threshold capacitance, performing a lower capacitance measurement in the capacitance meter, using a second measurement of the capacitance using a second frequency; and when the first measurement of the capacitance indicates the capacitance being above a threshold capacitance, performing a higher capacitance measurement in the capacitance meter, using a second measurement of the capacitance using a third frequency, the third frequency being lower than the second frequency.

This method will result in more accurate measurements due to the following effects. Higher frequencies provide a higher current or measurement signal at low capacitances. Furthermore, lower frequencies reduce the current and voltage drop in the cable for higher capacitances. Consequently, it is beneficial to use higher frequencies for lower capacitances and lower frequencies for higher capacitances.

The performing the lower capacitance measurement may involve using the second frequency and a fourth frequency, wherein the second and fourth frequencies differ, and the performing the higher capacitance measurement may involve using the third frequency and a fifth frequency, wherein the third and fifth frequencies differ. Using two frequencies improve the accuracy of the measurement even further. Furthermore, using two frequencies makes it possible to calculate a parasitic resistance, e.g. in cables, whereby this can be compensated for in calculations.

The fourth frequency and the fifth frequency may be equal. This simplifies the construction of the capacitance meter by reducing the number of frequencies that are required to be generated.

The first frequency, the fourth frequency and the fifth frequency may all be equal. This simplifies the construction of the capacitance meter even further by reducing the number of frequencies that are required to be generated.

The first frequency may be higher than the third frequency and the first frequency may be lower than the second frequency. In other words, the first frequency is the middle frequency.

The second measurement being performed may be more accurate than the first measurement. This is due to the active selection of frequencies depending on the first measurement of the capacitance.

The method may further comprise the step of presenting a measured capacitance as the capacitance measured in the performed second measurement.

A second aspect of the invention is a capacitance meter for measuring a capacitance. The capacitance meter comprises: an AC power source with a controllable frequency which is fed to the capacitor to measure its capacitance, and a controller. The controller is arranged to: perform a first measurement of the capacitance using a first frequency; when the first measurement of the capacitance indicates the capacitance being below a threshold capacitance, perform a lower capacitance measurement in the capacitance meter, using a second measurement of the capacitance using a second frequency; and when the first measurement of the capacitance indicates the capacitance being above a threshold capacitance, perform a higher capacitance measurement in the capacitance meter, using a second measurement of the capacitance using a third frequency, the third frequency being lower than the second frequency.

A third aspect of the invention is a computer program for measuring capacitance, the computer program comprising computer program code which, when run on in a capacitance meter, causes the capacitance meter to perform the method according to the first aspect.

A fourth aspect of the invention is a computer program product comprising a computer program according to the third aspect and a computer readable means on which the computer program is stored.

Whenever the term equals is used herein, it is to be interpreted to be the same within a margin of error. The margin of error is set appropriately, such as to a few percent or similar.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF DRAWINGS

The invention is now described, by way of example, with reference to the accompanying drawings, in which.

DETAILED DESCRIPTION OF PREFERRED EMBODIMENTS

The present invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Figure 1:
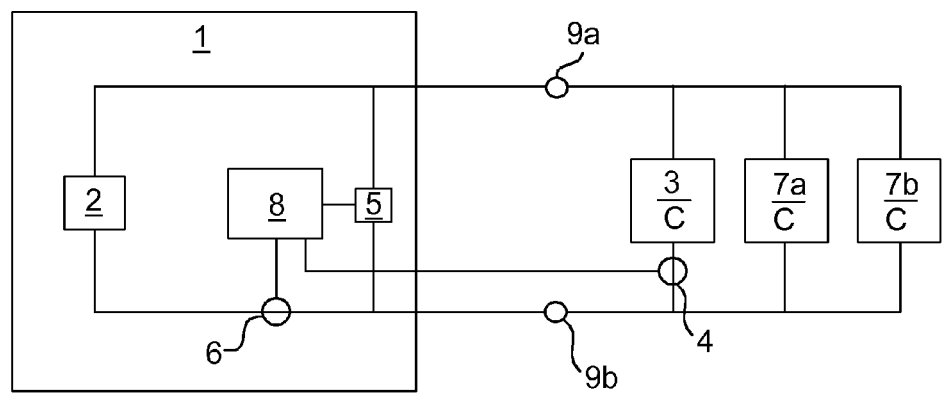
FIG. 1 is a schematic diagram showing a capacitance meter according to an embodiment of the present invention, where the focus is on elements used to measure a capacitance of a component to be tested.

FIG. 1 is a schematic diagram showing a capacitance meter 1 according to an embodiment of the present invention, where the focus is on elements used to measure a capacitance of a capacitor 3. It is to be noted that while the capacitive effects of the capacitor 3 are dominant, there may be resistive and inductive components to the capacitor 3 and/or cabling connecting the capacitor 3 and the capacitance meter 1. It will be shown below with reference to FIG. 4 how the effect of resistive components can be reduced or even eliminated. The capacitor 3 can for example be a capacitor in a capacitor bank.

The capacitance meter 1 connects to the capacitor 3 by means of connectors 9a-b. The capacitance meter 1 comprises an AC voltage source 2 which generates a measurement voltage. The AC voltage source 2 typically comprises resistors and other components (not shown) as well as the actual power source. The AC source can comprise a battery and an inverter to generate the AC power. The capacitance meter 1 is adapted to measure capacitances from 1 to 1000 µF. The AC voltage source can for example be controlled using pulse width modulation from a microprocessor (e.g. controller 8). The AC voltage source further comprises an amplifier and a low pass filter, e.g. an inductor. While the AC source can have any suitable output voltage, it can be restricted to 1-1.4 volts in order to stay below the trigger voltage of any connected diodes.

The AC measurement voltage will result in a current going to and from the capacitor 3. A voltage sensor 5, such as a voltmeter, measures the voltage across the capacitor 3 and a current sensor 6, such as a ammeter, measures the current going to and from the capacitor 3.

Optionally, there are other capacitors 7a-b connected in parallel to the capacitor 3 to be measured. In this situation, a second current sensor 4 is used to measure the current going to or from the capacitor 3 to be measured. The second current sensor 4 is also connected to the controller 8 for calculation of the capacitance of the capacitor 3 to be measured.

A controller 8 oversees the whole measurement process and calculates a measured capacitance using the measured voltage and current. The controller can be a CPU (Central Processing Unit), a FPGA (Field-programmable Gate Array), a DSP (Digital Signal Processor) or any suitable programmable electronic logic unit.

In order to reduce the risk of singularities affecting the measurement, the capacitance measurement can be performed three times, whereby the median value is used as the measured capacitance. Optionally, the measurement is performed at two different frequencies, where three measurements are taken at the two frequencies. The measurement used can then be taken as the average of the two median values of the six measurements.

Figure 2:
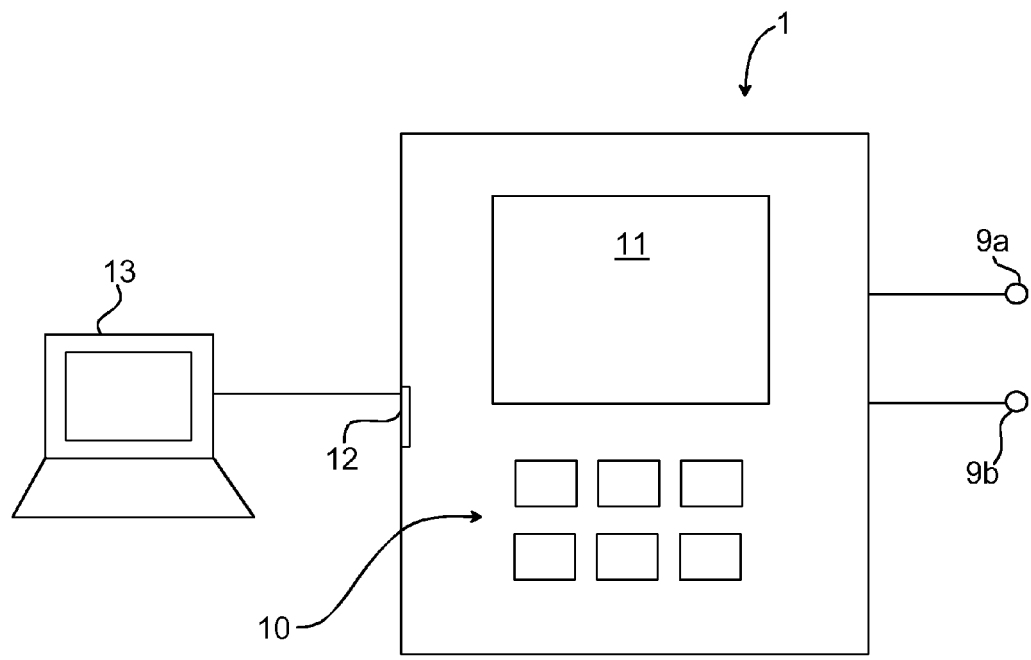
FIG. 2 is a schematic diagram showing the capacitance meter of FIG. 1, where the focus is on interfaces of the capacitance meter.

FIG. 2 is a schematic diagram showing the capacitance meter of FIG. 1, where the focus is on interfaces of the capacitance meter. The capacitance meter 1 comprises a display 11 and a keypad 10. This allows a user to interface with the capacitance meter 1, e.g. to measure capacitance of a specific capacitor 3 and store the measured capacitance along with an identity of the capacitor, allowing history to be kept.

An data interface 12 allows the capacitance meter 1 to send and/or receive data with a computer 13, such as a general purpose stationary or portable computer. The data interface 12 can for example be an interface of type USB (Universal Serial Bus), a Centronics parallel interface, an RS-232 serial interface, or an Ethernet interface. The data interface 12 can also be a wireless interface such as Bluetooth, wireless LAN or wireless USB interface. For example, the data interface 12 can be used to allow central collection of capacitance measurements.

Figure 3:
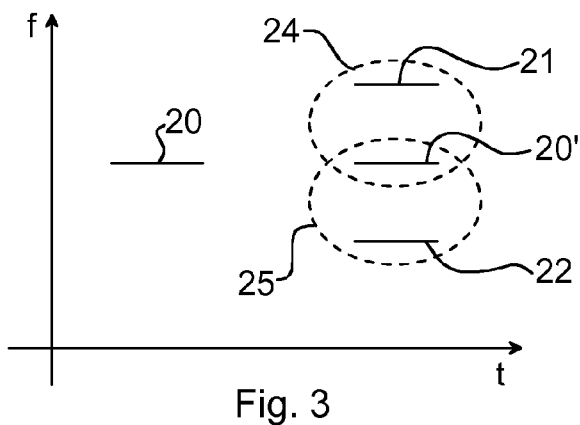
FIG. 3 is a graph illustrating the use of frequencies in capacitance measurements in the capacitance meter of FIGS. 1 and 2.

FIG. 3 is a graph illustrating the use of frequencies in capacitance measurements in the capacitance meter of FIGS. 1 and 2. The idea is to take a first rough measurement at a middle frequency 20 of the capacitor. If the rough measurement indicates that the capacitor is below a threshold capacitance, a second measurement 24 is performed using a higher frequency 21 and a middle frequency 20', which may be equal to the middle frequency 20 used for the first rough measurement. If the rough measurement indicates that the capacitor is above a threshold capacitance, a second measurement 25 is performed using a lower frequency 22 and the middle frequency 20', which may be equal to the middle frequency 20 used for the first rough measurement. The threshold capacitance can be selected as any suitable capacitance; in this embodiment, the threshold capacitance is selected as 200 µF.

The reason for this is to compensate for the following effects. Higher frequencies provide a higher current or measurement signal at low capacitances. Furthermore, lower frequencies reduce the current and voltage drop in the cable for higher capacitances. Consequently, it is beneficial to use higher frequencies for lower capacitances and lower frequencies for higher capacitances. The frequencies can be selected as any suitable frequencies. In this embodiment, the lower frequency 22 is selected to be 40 Hz, the middle frequency 20, 20' is selected to be 80 Hz and the higher frequency 21 is selected to be 160 Hz.

Figure 4:
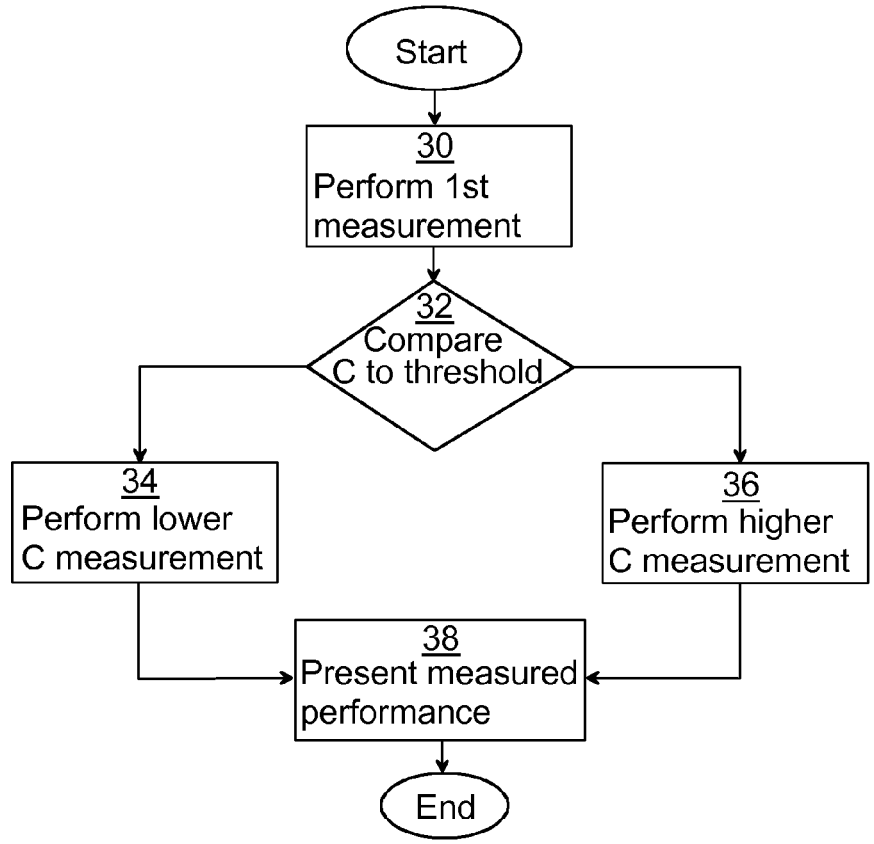
FIG. 4 is a flow chart showing a method which can be executed in the capacitance meter of FIGS. 1 and 2.

FIG. 4 is a flow chart showing a method which can be executed in the capacitance meter 1 of FIGS. 1 and 2. The method starts when a measurement is triggered, e.g. by a user of the capacitance meter 1 activating capacitance measurement of a capacitor.

In an initial perform first measurement step 30, a first rough measurement of the capacitance is performed.

In a subsequent conditional compare C (capacitance) to threshold step, the rough measurement of the capacitance from the previous step is compared to a threshold capacitance. If the first rough measurement of the capacitance is below the threshold, the method continues to a perform lower C (capacitance) measurement step 34. If the first rough measurement is above the threshold, the method continues to a perform higher C (capacitance) measurement step 36. It is not important what happens if the first rough measurement of the capacitance is exactly on the threshold capacitance. This would be a very rare singularity and the method could be configured to in this case either go to the perform lower C (capacitance) measurement step 34 or the perform higher C (capacitance) measurement step 36.

In the perform lower C (capacitance) measurement step, a second, more accurate, measurement of the capacitance is performed. This is done using a higher frequency. Optionally, two frequencies are used, such as a higher frequency and the frequency used in the first rough measurement in step 30.

In the perform higher C (capacitance) measurement step, a second, more accurate, measurement of the capacitance is performed. This is done using a lower frequency. Optionally, two frequencies are used, such as a lower frequency and the frequency used in the first rough measurement in step 30.

After the second measurement has been performed in either of steps 34 and 36 above, the measured capacitance is presented in a present measured capacitance step 38. In this step, the second, more accurate, measurement of the capacitance is presented, as obtained from either of the prior steps 34 or 36. The measurement can for example be presented in the display of the capacitance meter or sent over the data interface.

Figure 5:
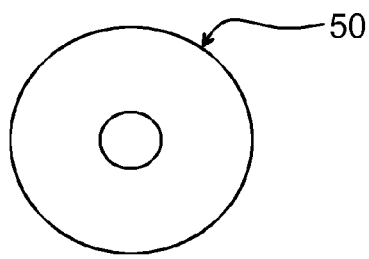
FIG. 5 shows one example of a computer program product comprising computer readable means.

FIG. 5 shows one example of a computer program product comprising computer readable means 50. On this computer readable means 50 a computer program can be stored, which computer program can cause a controller to execute the method according to embodiments described herein. In this example, the computer program product is an optical disc, such as a CD (compact disc), a DVD (digital versatile disc) or a blu-ray disc. The computer readable means can also be solid state memory, such as flash memory or a software package distributed over a network, such as the Internet.

The invention has mainly been described above with reference to a few embodiments. However, as is readily appreciated by a person skilled in the art, other embodiments than the ones disclosed above are equally possible within the scope of the invention.

The invention claimed is:

1. A method for measuring a capacitance using a capacitance meter, the capacitance meter comprising an AC power source with a controllable frequency which is fed to a capacitor to measure a capacitance of the capacitor, the method comprising:
    performing, in the capacitance meter, a first measurement of the capacitance using a first frequency;
    when the first measurement of the capacitance indicates the capacitance is below a threshold capacitance, performing a lower capacitance measurement in the capacitance meter, using a second measurement of the capacitance using a second frequency; and
    when the first measurement of the capacitance indicates the capacitance is above a threshold capacitance, performing a higher capacitance measurement in the capacitance meter, using a second measurement of the capacitance using a third frequency, the third frequency being lower than the second frequency,
    wherein the performing the lower capacitance measurement involves using the second frequency and a fourth frequency, wherein the second and fourth frequencies differ, and wherein the performing the higher capacitance measurement involves using the third frequency and a fifth frequency, wherein the third and fifth frequencies differ.

2. The method according to claim 1, wherein the fourth frequency and the fifth frequency are equal.

3. The method according to claim 2, wherein the first frequency, the fourth frequency and the fifth frequency are all equal.

4. The method according to claim 1, wherein the first frequency is higher than the third frequency and the first frequency is lower than the second frequency.

5. The method according to claim 1, wherein the second measurement being performed is more accurate than the first measurement.

6. The method according to claim 1, further comprising:
    presenting a measured capacitance as the capacitance measured in the performed second measurement.

7. A capacitance meter for measuring a capacitance, said capacitance meter comprising:
    an AC power source with a controllable frequency which is fed to a capacitor to measure a capacitance of the capacitor, and
    a controller,
    wherein the controller is arranged to:
    perform a first measurement of the capacitance using a first frequency;
    when the first measurement of the capacitance indicates the capacitance is below a threshold capacitance, perform a lower capacitance measurement in the capacitance meter, using a second measurement of the capacitance using a second frequency; and
    when the first measurement of the capacitance indicates the capacitance is above a threshold capacitance, perform a higher capacitance measurement in the capacitance meter, using a second measurement of the capacitance using a third frequency, the third frequency being lower than the second frequency,
    wherein the controller is configured to perform the lower capacitance measurement involves using the second frequency and a fourth frequency, wherein the second and fourth frequencies differ, and wherein the controller is configured to perform the higher capacitance measurement involves using the third frequency and a fifth frequency, wherein the third and fifth frequencies differ.

8. A computer program for measuring capacitance recorded on a non-transitory computer readable medium, the computer program comprising
    computer program code which, when run on in a capacitance meter, causes the capacitance meter to perform a method for measuring a capacitance using a capacitance meter, the capacitance meter comprising an AC power source with a controllable frequency which is fed to a capacitor to measure a capacitance of the capacitor, the method comprising
    performing, in the capacitance meter, a first measurement of the capacitance using a first frequency;
    when the first measurement of the capacitance indicates the capacitance is below a threshold capacitance, performing a lower capacitance measurement in the capacitance meter, using a second measurement of the capacitance using a second frequency; and
    when the first measurement of the capacitance indicates the capacitance is above a threshold capacitance, performing a higher capacitance measurement in the capacitance meter, using a second measurement of the capacitance using a third frequency, the third frequency being lower than the second frequency,
    wherein the performing the lower capacitance measurement involves using the second frequency and a fourth frequency, wherein the second and fourth frequencies differ, and wherein the performing the higher capacitance measurement involves using the third frequency and a fifth frequency, wherein the third and fifth frequencies differ.

* * * * *